US012609239B2

(12) United States Patent
Tan et al.

(10) Patent No.: US 12,609,239 B2
(45) Date of Patent: Apr. 21, 2026

(54) MAGNETIC COUPLING COIL OPTIMIZATION METHOD, DEVICE, COMPUTER EQUIPMENT AND STORAGE MEDIUM

(71) Applicant: Electric Power Research Institute of Yunnan Power Grid Co., Ltd., Kunming (CN)

(72) Inventors: Xiangyu Tan, Kunming (CN); Wenyun Li, Kunming (CN); Gang Ao, Kunming (CN); Xiaowei Xu, Kunming (CN); Yong Lu, Kunming (CN); Wenbin Zhang, Kunming (CN); Shan Wang, Kunming (CN)

( * ) Notice: Subject to any disclaimer, the term of this patent is extended or adjusted under 35 U.S.C. 154(b) by 251 days.

(21) Appl. No.: 18/571,669

(22) PCT Filed: Aug. 30, 2023

(86) PCT No.: PCT/CN2023/115850
§ 371 (c)(1),
(2) Date: Dec. 18, 2023

(87) PCT Pub. No.: WO2024/103904
PCT Pub. Date: May 23, 2024

(65) Prior Publication Data
US 2025/0087415 A1      Mar. 13, 2025

(30) Foreign Application Priority Data
Nov. 15, 2022     (CN) .......................... 202211423594.8

(51) Int. Cl.
*H01F 27/42*     (2006.01)
*G01R 33/12*     (2006.01)
(52) U.S. Cl.
CPC ......... *H01F 27/42* (2013.01); *G01R 33/1223* (2013.01)

(58) Field of Classification Search
CPC ..... H01F 27/42; H01F 38/14; G01R 33/1223; G06F 30/20; G06F 2113/04; Y02T 10/70
See application file for complete search history.

(56) References Cited

U.S. PATENT DOCUMENTS

2002/0047346 A1* 4/2002 Miekka ................... B60L 50/60
                                                              310/68 B
2006/0219499 A1* 10/2006 Organek ................. H01F 13/00
                                                              188/164

(Continued)

FOREIGN PATENT DOCUMENTS

CN          106981995 A      7/2017
CN          111257609 A      6/2020
CN          115640701 A      1/2023

*Primary Examiner* — Thienvu V Tran
*Assistant Examiner* — Muaamar Qahtan Al-Taweel

(57) ABSTRACT

This application proposes a magnetic coupling coil optimization method. The method comprises: calculating an equivalent magnetic permeability of a magnetic coupling coil based on an air gap length of the magnetic coupling coil; calculating an effective cross-sectional area of the magnetic coupling coil based on the equivalent magnetic permeability and the power of the magnetic coupling coil; calculating a number of turns of the secondary winding of the magnetic coupling coil based on the effective cross-sectional area and the equivalent magnetic permeability; optimizing the magnetic coupling coil based on the number of turns of the secondary winding. The present application can reasonably configure the parameters of the magnetic coupling coil, effectively acquire energy from the power grid to provide stable power for detection or communication equipment in the power grid, and make the magnetic coupling coil more reliable while meeting the power demand.

15 Claims, 2 Drawing Sheets

(56)    References Cited

U.S. PATENT DOCUMENTS

2009/0302863 A1* 12/2009 Schinkel ................ H02P 23/14
                                         324/555
2011/0266880 A1* 11/2011 Kim ....................... H02J 50/12
                                         307/104
2013/0207601 A1*  8/2013 Wu ....................... B60L 53/126
                                         320/108
2015/0028689 A1*  1/2015 Arisawa ................ G01V 3/101
                                         307/104
2017/0011842 A1*  1/2017 Ishigaki ................ H01F 27/38
2017/0228340 A1*  8/2017 Remus ................... G06F 30/15

* cited by examiner

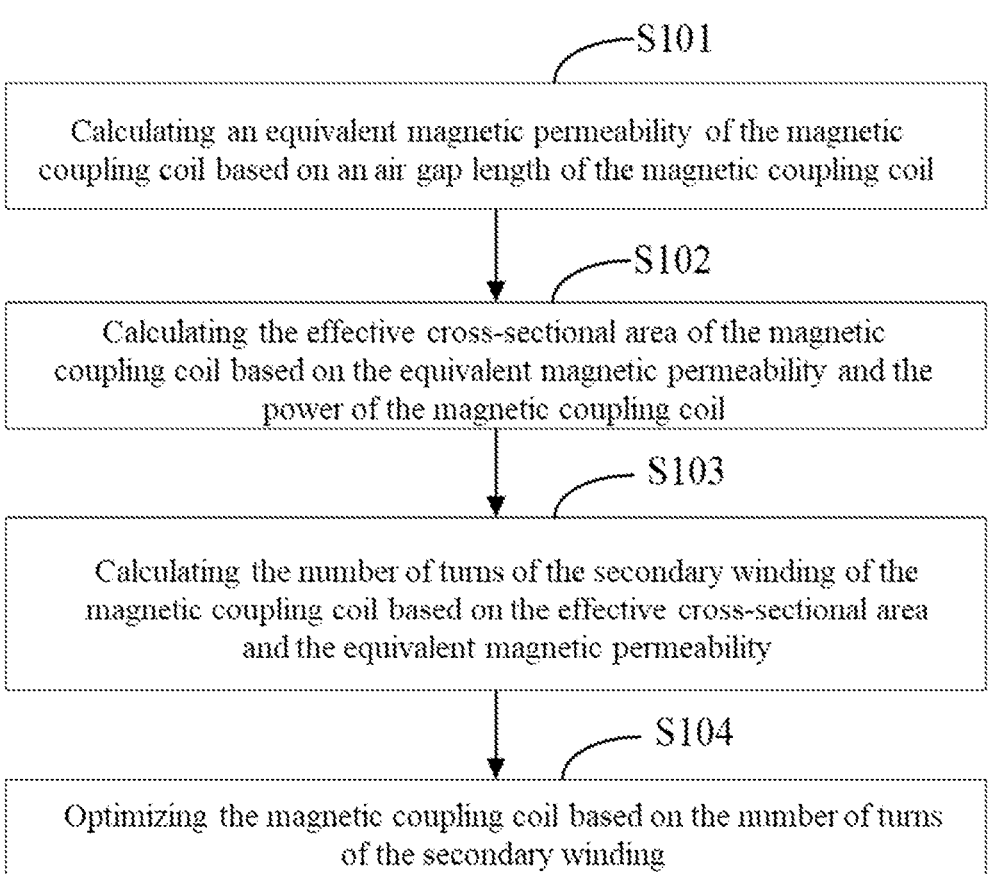

S101

Calculating an equivalent magnetic permeability of the magnetic coupling coil based on an air gap length of the magnetic coupling coil

S102

Calculating the effective cross-sectional area of the magnetic coupling coil based on the equivalent magnetic permeability and the power of the magnetic coupling coil

S103

Calculating the number of turns of the secondary winding of the magnetic coupling coil based on the effective cross-sectional area and the equivalent magnetic permeability

S104

Optimizing the magnetic coupling coil based on the number of turns of the secondary winding

FIG. 1

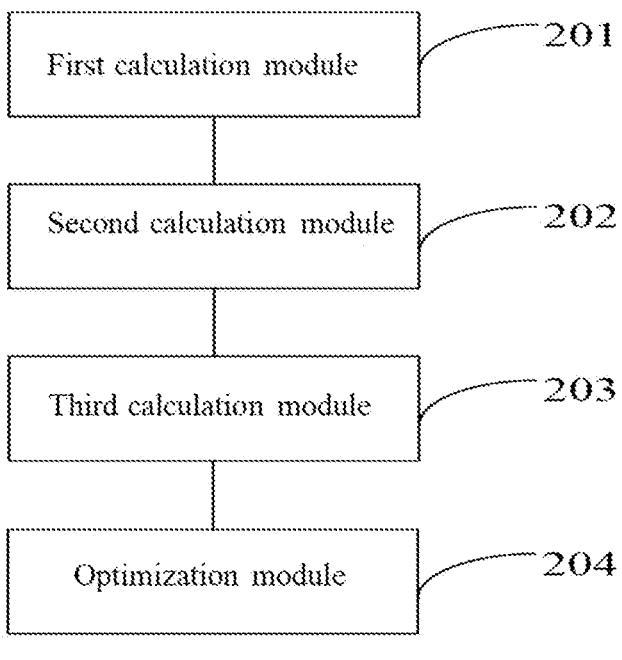

First calculation module        201

Second calculation module        202

Third calculation module        203

Optimization module        204

FIG. 2

MAGNETIC COUPLING COIL OPTIMIZATION METHOD, DEVICE, COMPUTER EQUIPMENT AND STORAGE MEDIUM

FIELD OF THE INVENTION

The present invention generally relates to power and electrical technology, and in particular to a magnetic coupling coil optimization method, device, computer equipment and storage medium.

BACKGROUND OF THE INVENTION

As the core content of the future development of the power industry, smart grid can protect the large-scale and efficient development of green energy, play important role in optimizing allocation of resources, serving the development of economy, contributing to the comprehensive, coordinated and sustainable development of economy and society, bearing very important practical significance. However, it is difficult for the energy acquisition devices in the existing smart grid to acquire energy and supply power. They are large in size, high in cost, and have large distortion signals. They cannot effectively acquire energy from the grid to provide stable power for detection or communication equipment in the grid, which greatly restricts the development of smart grids.

SUMMARY OF THE INVENTION

This application proposes a magnetic coupling coil optimization method, device, computer equipment and storage medium to solve the technical problem in the existing technology of being unable to effectively acquire energy from the power grid to provide stable power for detection or communication equipment in the power grid.

In accordance with a first aspect, the present application proposes a magnetic coupling coil optimization method, the method comprises: calculating an equivalent magnetic permeability of the magnetic coupling coil based on an air gap length of the magnetic coupling coil; calculating an effective cross-sectional area of the magnetic coupling coil based on the equivalent magnetic permeability and power of the magnetic coupling coil; calculating number of turns of the secondary winding of the magnetic coupling coil based on the effective cross-sectional area and the equivalent magnetic permeability; optimizing the magnetic coupling coil based on the number of turns of the secondary winding.

Incorporated with the first aspect, in one embodiment, the magnetic coupling coil is an open type winding.

Incorporated with the first aspect, in one embodiment, calculating the equivalent magnetic permeability of the magnetic coupling coil based on the air gap length of the magnetic coupling coil comprises: calculating the inner diameter and outer diameter of the magnetic coupling coil based on a saturation excitation current of the magnetic coupling coil; calculating an average magnetic path length of the magnetic coupling coil based on the inner diameter and outer diameter of the magnetic coupling coil; calculating the equivalent magnetic permeability of the magnetic coupling coil based on the air gap length and the average magnetic path length of the magnetic coupling coil.

Incorporated with the first aspect, in one embodiment, calculating the outer diameter of the magnetic coupling coil based on a saturation excitation current of the magnetic coupling coil comprises: calculating the outer diameter of the magnetic coupling coil based on the saturation excitation current of the magnetic coupling coil and the following saturation excitation current calculation formula:

$$I_{umax} = \frac{\pi B_s (D - d)}{u_0 u_r \ln\frac{D}{d}}$$

where, $I_{umax}$ is the saturation excitation current of the magnetic coupling coil, $B_s$ is the saturation magnetic induction intensity of the magnetic coupling coil, $u_0$ is the vacuum permeability of the magnetic coupling coil, $u_r$ is the relative permeability of the magnetic core when it is not cut, D is the outer diameter of the magnetic coupling coil, d is the inner diameter of the magnetic coupling coil.

Incorporated with the first aspect, in one embodiment, calculating the effective cross-sectional area of the magnetic coupling coil based on the equivalent magnetic permeability and the power of the magnetic coupling coil comprises: calculating the effective cross-sectional area of the magnetically coupled winding based on the equivalent magnetic permeability, the power of the magnetic coupling coil and the following power formula:

$$P = \frac{U_2^2}{R} = \frac{\pi \mu f A I_1^2}{l}$$

where, $U_2$ represents the output voltage of the magnetic coupling coil, R represents the load resistance, f represents the frequency of the primary current, $I_1$ represents the magnitude of the primary current, and A represents the effective cross-sectional area of the magnetic coupling coil, l represents the average magnetic path length of the magnetic coupling coil, $\mu$ represents the equivalent magnetic permeability of the magnetic coupling coil.

Incorporated with the first aspect, in one embodiment, the method further comprises: designing an anti-surge module based on the power of the magnetic coupling coil, the anti-surge module being connected to the output end of the magnetic coupling coil, and the anti-surge module being used to protect a circuit in connection with the magnetic coupling coil.

Incorporated with the first aspect, in one embodiment, the method further comprises: designing an overvoltage protection module based on the output voltage of the magnetic coupling coil, the overvoltage protection module being connected to the output end of the magnetic coupling coil, and the overvoltage protection module is used to protect circuit connected to the magnetic coupling coil.

In accordance with a second aspect, the present application proposes a magnetic coupling coil optimization device, the device comprises:
  a first calculation module, configure for calculating an equivalent magnetic permeability of the magnetic coupling coil based on the air gap length of the magnetic coupling coil;
  a second calculation module, configured for calculating an effective cross-sectional area of the magnetic coupling coil based on the equivalent magnetic permeability and a power of the magnetic coupling coil;
  a third calculation module configured for calculating number of turns of the secondary winding of the magnetic coupling coil based on the effective cross-sectional area and the equivalent magnetic permeability;

an optimization module configured for optimizing the magnetic coupling coil based on the number of turns of the secondary winding.

Incorporated with the second aspect, in one embodiment, the magnetic coupling coil is an open type winding.

Incorporated with the second aspect, in one embodiment, the first calculation module is specifically configured for: calculating the inner diameter and outer diameter of the magnetic coupling coil based on a saturation excitation current of the magnetic coupling coil; calculating an average magnetic path length of the magnetic coupling coil based on the inner diameter and outer diameter of the magnetic coupling coil; calculating the equivalent magnetic permeability of the magnetic coupling coil based on the air gap length and the average magnetic path length of the magnetic coupling coil.

Incorporated with the second aspect, in one embodiment, the first calculation module is further specifically configured for: Calculating the outer diameter of the magnetic coupling coil based on the saturation excitation current of the magnetic coupling coil and the following saturation excitation current calculation formula:

$$I_{umax} = \frac{\pi B_s(D-d)}{u_0 u_r \ln\frac{D}{d}}$$

where, $I_{umax}$ is the saturation excitation current of the magnetic coupling coil, $B_s$ is the saturation magnetic induction intensity of the magnetic coupling coil, $u_0$ is the vacuum permeability of the magnetic coupling coil, $u_r$ is the relative permeability of the magnetic core when it is not cut, D is the outer diameter of the magnetic coupling coil, d is the inner diameter of the magnetic coupling coil.

Incorporated with the second aspect, in one embodiment, the second calculation module is specifically configured for: calculating the effective cross-sectional area of the magnetic coupling coil based on the equivalent magnetic permeability, the power of the magnetic coupling coil and the following power formula:

$$P = \frac{U_2^2}{R} = \frac{\pi \mu f A I_1^2}{l}$$

where, P represents the power of the magnetic coupling coil, $U_2$ represents the output voltage of the magnetic coupling coil, R represents the load resistance, f represents the frequency of the primary current, $I_1$ represents the magnitude of the primary current, and A represents the effective cross-sectional area of the magnetic coupling coil, l represents the average magnetic path length of the magnetic coupling coil, μ represents the equivalent magnetic permeability of the magnetic coupling coil.

Incorporated with the second aspect, in one embodiment, the device further comprises a first design module configured for: designing an anti-surge module based on the power of the magnetic coupling coil, the anti-surge module being connected to the output end of the magnetic coupling coil, and the anti-surge module being used to protect a circuit in connection with the magnetic coupling coil.

Incorporated with the second aspect, in one embodiment, the device further comprises a second design module configured for: designing an overvoltage protection module based on the output voltage of the magnetic coupling coil, the overvoltage protection module being connected to the output end of the magnetic coupling coil, and the overvoltage protection module is used to protect circuit connected to the magnetic coupling coil.

In accordance with a third aspect, the present application proposes a computer device comprising a memory and a processor, the memory storing a computer program such that when the computer program is executed by the processor, the processor performs the following steps:

calculating an equivalent magnetic permeability of the magnetic coupling coil based on an air gap length of the magnetic coupling coil;

calculating an effective cross-sectional area of the magnetic coupling coil based on the equivalent magnetic permeability and power of the magnetic coupling coil;

calculating number of turns of the secondary winding of the magnetic coupling coil based on the effective cross-sectional area and the equivalent magnetic permeability;

optimizing the magnetic coupling coil based on the number of turns of the secondary winding.

Incorporated with the third aspect, in one embodiment, the magnetic coupling coil is an open type winding.

Incorporated with the third aspect, in one embodiment, calculating the equivalent magnetic permeability of the magnetic coupling coil based on the air gap length of the magnetic coupling coil comprises: calculating the inner diameter and outer diameter of the magnetic coupling coil based on a saturation excitation current of the magnetic coupling coil; calculating an average magnetic path length of the magnetic coupling coil based on the inner diameter and outer diameter of the magnetic coupling coil; calculating the equivalent magnetic permeability of the magnetic coupling coil based on the air gap length and the average magnetic path length of the magnetic coupling coil.

Incorporated with the third aspect, in one embodiment, calculating the outer diameter of the magnetic coupling coil based on a saturation excitation current of the magnetic coupling coil comprises: calculating the outer diameter of the magnetic coupling coil based on the saturation excitation current of the magnetic coupling coil and the following saturation excitation current calculation formula:

$$I_{umax} = \frac{\pi B_s(D-d)}{u_0 u_r \ln\frac{D}{d}}$$

where, $I_{umax}$ is the saturation excitation current of the magnetic coupling coil, $B_s$ is the saturation magnetic induction intensity of the magnetic coupling coil, $u_0$ is the vacuum permeability of the magnetic coupling coil, $u_r$ is the relative permeability of the magnetic core when it is not cut, D is the outer diameter of the magnetic coupling coil, d is the inner diameter of the magnetic coupling coil.

Incorporated with the third aspect, in one embodiment, calculating the effective cross-sectional area of the magnetic coupling coil based on the equivalent magnetic permeability and the power of the magnetic coupling coil comprises:

calculating the effective cross-sectional area of the magnetically coupled winding based on the equivalent magnetic permeability, the power of the magnetic coupling coil and the following power formula:

$$P = \frac{U_2^2}{R} = \frac{\pi \mu f A I_1^2}{l}$$

where, $U_2$ represents the output voltage of the magnetic coupling coil, R represents the load resistance, f represents the frequency of the primary current, $I_1$ represents the magnitude of the primary current, and A represents the effective cross-sectional area of the magnetic coupling coil, l represents the average magnetic path length of the magnetic coupling coil, $\mu$ represents the equivalent magnetic permeability of the magnetic coupling coil.

Incorporated with the third aspect, in one embodiment, the method further comprises: designing an anti-surge module based on the power of the magnetic coupling coil, the anti-surge module being connected to the output end of the magnetic coupling coil, and the anti-surge module being used to protect a circuit in connection with the magnetic coupling coil.

Incorporated with the third aspect, in one embodiment, the method further comprises: designing an overvoltage protection module based on the output voltage of the magnetic coupling coil, the overvoltage protection module being connected to the output end of the magnetic coupling coil, and the overvoltage protection module is used to protect circuit connected to the magnetic coupling coil.

In accordance with a fourth aspect, the present application proposes a computer-readable storage medium characterized in storing a computer program such that when the computer program is executed by a processor, the processor performs the following steps:

calculating an equivalent magnetic permeability of the magnetic coupling coil based on an air gap length of the magnetic coupling coil;

calculating an effective cross-sectional area of the magnetic coupling coil based on the equivalent magnetic permeability and power of the magnetic coupling coil;

calculating number of turns of the secondary winding of the magnetic coupling coil based on the effective cross-sectional area and the equivalent magnetic permeability;

optimizing the magnetic coupling coil based on the number of turns of the secondary winding.

Incorporated with the fourth aspect, in one embodiment, the magnetic coupling coil is an open type winding.

Incorporated with the fourth aspect, in one embodiment, calculating the equivalent magnetic permeability of the magnetic coupling coil based on the air gap length of the magnetic coupling coil comprises: calculating the inner diameter and outer diameter of the magnetic coupling coil based on a saturation excitation current of the magnetic coupling coil; calculating an average magnetic path length of the magnetic coupling coil based on the inner diameter and outer diameter of the magnetic coupling coil; calculating the equivalent magnetic permeability of the magnetic coupling coil based on the air gap length and the average magnetic path length of the magnetic coupling coil.

Incorporated with the fourth aspect, in one embodiment, calculating the outer diameter of the magnetic coupling coil based on a saturation excitation current of the magnetic coupling coil comprises: calculating the outer diameter of the magnetic coupling coil based on the saturation excitation current of the magnetic coupling coil and the following saturation excitation current calculation formula:

$$I_{umax} = \frac{\pi B_s (D - d)}{u_0 u_r \ln\dfrac{D}{d}}$$

where, $I_{umax}$ is the saturation excitation current of the magnetic coupling coil, $B_s$ is the saturation magnetic induction intensity of the magnetic coupling coil, $u_0$ is the vacuum permeability of the magnetic coupling coil, $u_r$ is the relative permeability of the magnetic core when it is not cut, D is the outer diameter of the magnetic coupling coil, d is the inner diameter of the magnetic coupling coil.

Incorporated with the fourth aspect, in one embodiment, calculating the effective cross-sectional area of the magnetic coupling coil based on the equivalent magnetic permeability and the power of the magnetic coupling coil comprises: calculating the effective cross-sectional area of the magnetically coupled winding based on the equivalent magnetic permeability, the power of the magnetic coupling coil and the following power formula:

$$P = \frac{U_2^2}{R} = \frac{\pi \mu f A I_1^2}{l}$$

where, $U_2$ represents the output voltage of the magnetic coupling coil, R represents the load resistance, f represents the frequency of the primary current, $I_1$ represents the magnitude of the primary current, and A represents the effective cross-sectional area of the magnetic coupling coil, l represents the average magnetic path length of the magnetic coupling coil, $\mu$ represents the equivalent magnetic permeability of the magnetic coupling coil.

Incorporated with the fourth aspect, in one embodiment, the method further comprises: designing an anti-surge module based on the power of the magnetic coupling coil, the anti-surge module being connected to the output end of the magnetic coupling coil, and the anti-surge module being used to protect a circuit in connection with the magnetic coupling coil.

Incorporated with the fourth aspect, in one embodiment, the method further comprises: designing an overvoltage protection module based on the output voltage of the magnetic coupling coil, the overvoltage protection module being connected to the output end of the magnetic coupling coil, and the overvoltage protection module is used to protect circuit connected to the magnetic coupling coil.

The present application can achieve the following beneficial effects: The present application proposes a magnetic coupling coil optimization method. The method includes: calculating the equivalent magnetic permeability of the magnetic coupling coil according to the air gap length of the magnetic coupling coil; calculating the effective cross-sectional area of the magnetic coupling coil based on the magnetic permeability and the power of the magnetic coupling coil; calculating the number of turns of the secondary winding of the magnetic coupling coil based on the effective cross-sectional area and the equivalent magnetic permeability; optimizing the magnetic coupling coil according to the number of turns of the secondary winding. The present application calculates the average magnetic path length and effective cross-sectional area of the magnetic coupling coil based on the equivalent magnetic permeability and the power of the magnetic coupling coil, and calculates the number of turns of the secondary winding of the magnetic coupling coil based on the effective cross-sectional area and equivalent magnetic permeability. It can reasonably configure the parameters of the magnetic coupling coil, effectively acquire energy from the power grid to provide stable power for detection or communication equipment in the power grid, and make the magnetic coupling coil more reliable while meeting the power demand.

BRIEF DESCRIPTION OF THE DRAWINGS

FIG. 1 is a schematic flow chart of a magnetic coupling coil optimization method provided by an embodiment of the present application.

FIG. 2 is a schematic structural diagram of a magnetic coupling coil optimization device provided by an embodiment of the present application.

DETAILED DESCRIPTION

Figure 3:
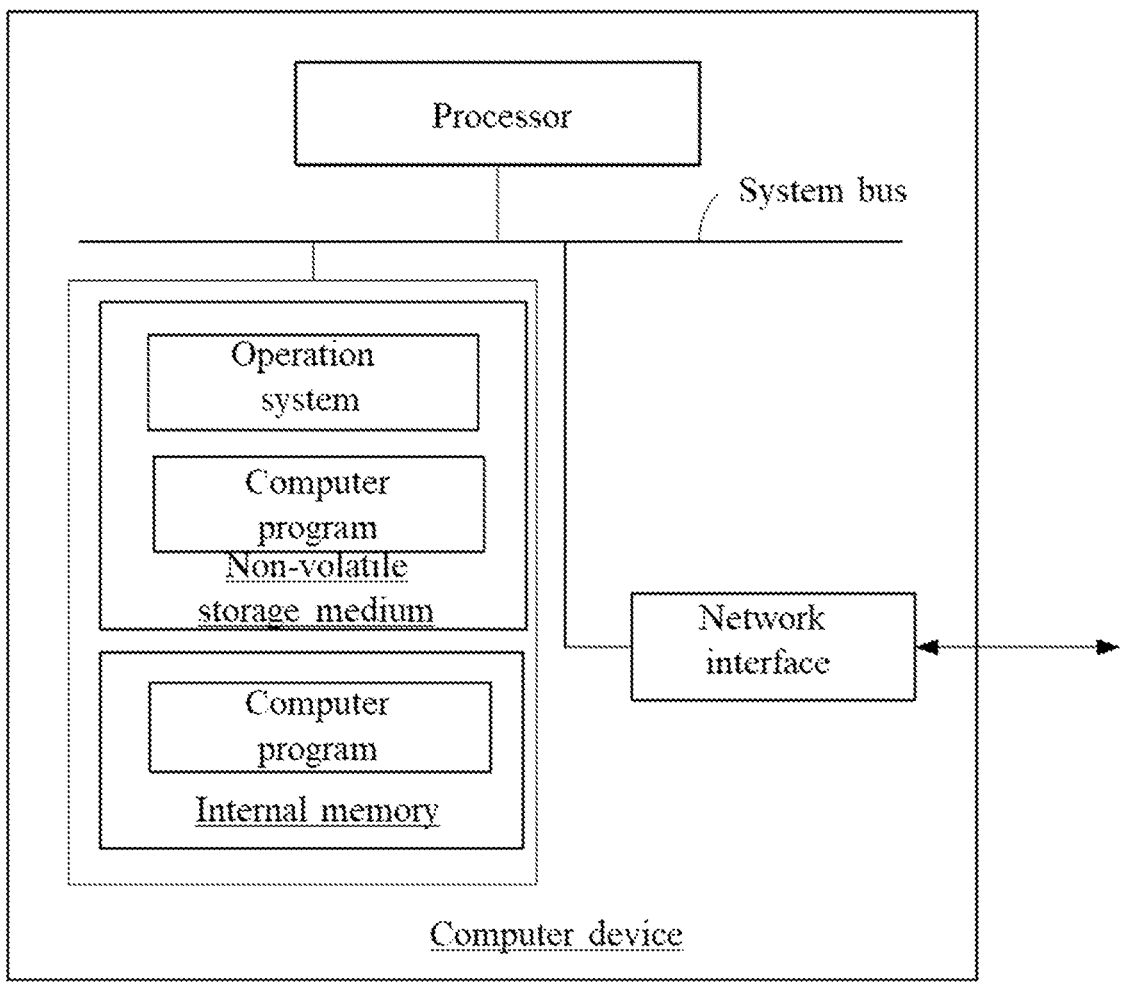
FIG. 3 is a schematic structural diagram of a computer device provided by an embodiment of the present application.

In order to clearly illustrate the purpose, technical solutions and advantages of the present invention, the present invention will be further described in detail below with reference to the accompanying drawings and embodiments. It should be understood that the specific embodiments described here are only for the purposes of illustration and description. It is not intended to be exhaustive or to limit the invention to the precise forms disclosed. In addition, the technical features involved in the various embodiments of the present invention described below can be combined with each other as long as they do not conflict with each other.

The technical solution proposed in this application is suitable for technical scenarios in which power is induced from transmission lines through magnetic coupling coils. Specifically, it is suitable for scenarios where, through the principle of electromagnetic induction, the magnetic coupling coil effectively obtains induction voltage to provide stable and reliable working power for the load.

Specifically, the magnetic coupling coil described in this application may be a magnetic coupling coil in a CT energy acquisition device.

In one embodiment, the present application proposes a magnetic coupling coil optimization method as shown in FIG. 1. FIG. 1 is a flow chart of a magnetic coupling coil optimization method provided by an embodiment of the present application. The method comprises:

Step 101: Calculating an equivalent magnetic permeability of the magnetic coupling coil based on an air gap length of the magnetic coupling coil.

Wherein, the magnetic coupling coil is an open type winding, the magnetic coupling coil is connected to a transmission line of a power grid to obtain an induction voltage from the transmission line through the principle of electromagnetic induction.

Specifically, the energy acquisition device can be connected to the transmission line by hanging on the transmission line.

Specifically, the magnetic coupling coil is a non-closed magnetic material. Before calculating the equivalent magnetic permeability of the magnetic coupling coil based on the air gap length of the magnetic coupling coil, it is needed to compare the magnetic core parameters of different materials to determine the magnetic core material of the magnetic coupling coil. Materials with larger initial magnetic permeability and saturation magnetic induction intensity may be selected as the winding core material. For example, it can be a closed-and-open type silicon steel winding. Since the closed-and-open type silicon steel winding uses magnetic materials with separate structures, based on the equality relationship between intensities of tangential components of the magnetic field on the interface of different magnetic media, the winding is wound in the direction of the tangential component, and by means of the magnetic amplification of the magnetic material, the magnetic field energy generated by cable current conduction can be effectively utilized to obtain electrical energy. Although the introduction of magnetic materials will change the distribution of the electromagnetic field around the cable, the magnetic induction intensity in the magnetic material will be much greater than the magnetic induction intensity in the air medium. The reason is that after the silicon steel winding is introduced, it can be seen from the interface boundary conditions of the magnetic field in the inhomogeneous medium that if the external magnetic field is incident on the silicon steel winding with a large incident angle, the refraction angle, that is, the tangential component, obtained in the silicon steel winding can be as large as possible to improve the efficiency of electric energy acquisition from the magnetic field energy generated by the cable current conduction.

Specifically, the magnetic coupling coil uses an open type silicon steel winding, which facilitates on-site installation and cost disclosure. However, the open type silicon steel winding introduces an air gap, which has a great impact on the magnetic permeability of the winding. Therefore, cross-sections of the winding need to be polished and rust-proofed during use, and the two cross-sections should be pressed as tightly and aligned as possible during installation.

Wherein, the equivalent magnetic permeability is the effective magnetic permeability of the magnetic coupling coil.

In one embodiment, calculating the equivalent magnetic permeability of the magnetic coupling coil based on the air gap length of the magnetic coupling coil comprises: calculating an inner diameter and an outer diameter of the magnetic coupling coil based on a saturation excitation current of the magnetic coupling coil; calculating an average magnetic path length of the magnetic coupling coil based on the inner diameter and outer diameter of the magnetic coupling coil; calculating the equivalent magnetic permeability of the magnetic coupling coil based on the air gap length and the average magnetic path length of the magnetic coupling coil.

Wherein, in one embodiment, before calculating the inner diameter and outer diameter of the magnetic coupling coil based on the saturation excitation current of the magnetic coupling coil, it is also needed to compare magnetic core parameters of different materials to determine magnetic core material. Specifically, materials with larger initial magnetic permeability and saturation magnetic induction intensity are selected as the winding core material. Determine the inner diameter length of the magnetic coupling coil based on the wire diameter of the field high-voltage circuit, as well as factors such as the thickness of the core protective box, the thickness of the winding, the thickness of the fixed structure of the inner core, and the thickness of the clamping structure between the cable and the energy-taking winding, so that the inner diameter length of the magnetic coupling coil is as small as possible.

Specifically, after determining the inner diameter of the magnetic coupling coil, it is also needed to determine the outer diameter of the magnetic coupling coil. The outer diameter of the magnetic coupling coil is calculated based on the saturation excitation current of the magnetic coupling coil. Calculating the outer diameter of the magnetic coupling coil based on the saturation excitation current of the magnetic coupling coil comprises:

Calculating the outer diameter of the magnetic coupling coil based on the saturation excitation current of the magnetic coupling coil and the following saturation excitation current calculation formula:

$$I_{umax} = \frac{\pi B_s (D-d)}{u_0 u_r \ln \frac{D}{d}}$$

Where, $I_{umax}$ is the saturation excitation current of the magnetic coupling coil, $B_s$ is the saturation magnetic induction intensity of the magnetic coupling coil, $u_0$ is the vacuum permeability of the magnetic coupling coil, $u_r$ is the relative permeability of the magnetic core when it is not cut, D is the outer diameter of the magnetic coupling coil, d is the inner diameter of the magnetic coupling coil.

Wherein, the saturation excitation current of the magnetic coupling coil is equal to the primary current.

Specifically, after determining the inner diameter and outer diameter of the magnetic coupling coil, the average magnetic path length of the magnetic coupling coil can be determined. Specifically, the average magnetic path length of the magnetic coupling coil is the sum of the inner diameter, outer diameter, and height of the magnetic coupling coil. The height of the magnetic coupling coil can be measured directly after determining the inner diameter and outer diameter.

Specifically, in order to facilitate the installation of the CT energy acquisition devices on high-voltage transmission lines, the magnetic coupling coil needs to be made as open type, so an air gap is inevitably introduced. Although the air gap can effectively prevent saturation, the air gap has an impact on the magnetic core permeability. The impact is relatively large. The cross section of the magnetic core should be polished to be smooth and the length of the air gap should be reduced as much as possible to minimize impact of the air gap. Then, the magnetic permeability of the magnetic coupling coil is the equivalent magnetic permeability of the magnetic coupling coil.

Specifically, after determining the average magnetic path length of the magnetic coupling coil, the equivalent magnetic permeability of the magnetic coupling coil can be calculated based on the air gap length and the average magnetic path length of the magnetic coupling coil. Calculating the equivalent magnetic permeability of the magnetic coupling coil based on the air gap length and the average magnetic path length of the magnetic coupling coil comprises:

Calculating the equivalent magnetic permeability of the magnetic coupling coil based on the air gap length of the magnetic coupling coil, the average magnetic path length and the following formula:

$$\mu = \frac{u_r}{1 + \frac{l_g}{l + l_g}}$$

Where, $\mu$ represents the equivalent magnetic permeability of the magnetic coupling coil, $u_r$ represents the relative permeability of the core when it is not cut, $l_g$ represents the air gap length of the magnetic coupling coil, l represents the average magnetic path length of the magnetic coupling coil.

Step 102: Calculating the effective cross-sectional area of the magnetic coupling coil based on the equivalent magnetic permeability and the power of the magnetic coupling coil.

Wherein, when the current is relatively small, the cross-sectional area of the magnetic core that meets the output power requirements can be obtained based on the current fluctuation range of the high-voltage circuit and the magnetic coupling coil output power formula, that is, referring to the power requirement of the load.

Specifically, calculating the effective cross-sectional area of the magnetic coupling coil based on the equivalent magnetic permeability and the power of the magnetic coupling coil comprises:

Calculating the effective cross-sectional area of the magnetic coupling coil based on the equivalent magnetic permeability, the power of the magnetic coupling coil and the following power formula:

$$P = \frac{U_2^2}{R} = \frac{\pi \mu f A I_1^2}{l}$$

where, P represents the power of the magnetic coupling coil, $U_2$ represents the output voltage of the magnetic coupling coil, R represents the load resistance, f represents the frequency of the primary current, $I_1$ represents the magnitude of the primary current, and A represents the effective cross-sectional area of the magnetic coupling coil, l represents the average magnetic path length of the magnetic coupling coil, $\mu$ represents the equivalent magnetic permeability of the magnetic coupling coil.

Step 103: Calculating the number of turns of the secondary winding of the magnetic coupling coil based on the effective cross-sectional area and the equivalent magnetic permeability.

Specifically, after determining the effective cross-sectional area of the magnetic coupling coil, the number of turns of the secondary winding of the magnetic coupling coil can be determined based on the following formula:

$$P = \frac{U_2^2}{R} = \frac{I_1^2}{\left(\frac{1}{k^2 N_2^2} + \frac{N_2^2}{R^2}\right)R} \leq \frac{k I_1^2}{2} = \frac{\pi \mu f A I_1^2}{l}$$

Where, P represents the power of the magnetic coupling coil, $U_2$ represents the output voltage of the magnetic coupling coil, R represents the load resistance, f represents the frequency of the primary current, $I_1$ represents the magnitude of the primary current, and A represents the effective cross-sectional area of the magnetic coupling coil, l represents the average magnetic path length of the magnetic coupling coil, $\mu$ represents the equivalent magnetic permeability of the magnetic coupling coil, and $N_2$ represents the number of turns of the secondary winding.

The winding output power reaches the maximum if and only if the number of turns of the secondary winding $N_2$ of the winding satisfies $N_2=\sqrt[l]{R/k}$, where the formula of k is:

$$k = \frac{2\pi\mu f A}{l}$$

f represents the frequency of the primary current, A represents the effective cross-sectional area of the magnetic coupling coil, and μ represents the equivalent magnetic permeability of the magnetic coupling coil.

Step 104: Optimizing the magnetic coupling coil based on the number of turns of the secondary winding.

Wherein, the winding method of the magnetic coupling coil should be optimized with respect to the number of turns of the secondary winding since the magnetic coupling coil causes serious interference when it is installed on the transmission line. On one hand, the winding density and cross-sectional area are kept uniform such that the influence of the parallel component of the interference magnetic field and the relative position changes of the wire and the winding can be eliminated or effectively reduced; on the other hand, a loop is wound around the center of the skeleton in a direction opposite to that of the winding such that the influence of the vertical component of the interference magnetic field can be eliminated or effectively reduced.

In one embodiment, the method further comprises: designing an anti-surge module based on the power of the magnetic coupling coil, the anti-surge module being connected to the output end of the magnetic coupling coil, and the anti-surge module being used to protect a circuit in connection with the magnetic coupling coil.

Wherein, in order to prevent instantaneous large currents such as lightning strikes from damaging subsequent circuits, it is selected to connect TVS bidirectional diodes in parallel at the output end of the magnetic coupling coil, and thoroughly consider the maximum allowable safety voltage of the circuit, the maximum pulse power it can withstand, etc., and select the appropriate model of the TVS bidirectional diode.

Specifically, the TVS bidirectional diode model is SMC6.5CA. Its maximum breakdown voltage is 11V. Its leakage current is extremely small, in an order of μA, during normal operation. Therefore, it can protect the subsequent circuit from damage when an instantaneous overvoltage occurs.

In one embodiment, the method further comprises: designing an overvoltage protection module based on the output voltage of the magnetic coupling coil, the overvoltage protection module being connected to the output end of the magnetic coupling coil, and the overvoltage protection module is used to protect circuit connected to the magnetic coupling coil.

Wherein, when the magnetic coupling coil outputs a relatively high voltage for a long time, in order to protect the subsequent circuit and enable the magnetic coupling coil to provide a stable voltage for the load, it is selected to connect a voltage regulating diode with a discharge resistor connected in parallel to the output end of the magnetic coupling coil.

Specifically, the discharge resistor can be a 180KD10 or MYG-10D180 varistor.

The present application proposes a magnetic coupling coil optimization method. The method comprises: calculating an equivalent magnetic permeability of a magnetic coupling coil based on an air gap length of the magnetic coupling coil; calculating an effective cross-sectional area of the magnetic coupling coil based on the equivalent magnetic permeability and the power of the magnetic coupling coil; calculating a number of turns of the secondary winding of the magnetic coupling coil based on the effective cross-sectional area and the equivalent magnetic permeability; optimizing the magnetic coupling coil based on the number of turns of the secondary winding. The present application calculates the average magnetic path length and effective cross-sectional area of the magnetic coupling coil based on the equivalent magnetic permeability and the power of the magnetic coupling coil, and calculates the number of turns of the secondary winding of the magnetic coupling coil based on the effective cross-sectional area and equivalent magnetic permeability; which can reasonably configure the parameters of the magnetic coupling coil, effectively acquire energy from the power grid to provide stable power for detection or communication equipment in the power grid, and make the magnetic coupling coil more reliable while meeting the power demand.

In one embodiment, the present application proposes a magnetic coupling coil optimization device, as shown in FIG. 2. FIG. 2 is a schematic structural diagram of a magnetic coupling coil optimization device provided by an embodiment of the present application. The device comprises:

a first calculation module 201 for calculating an equivalent magnetic permeability of the magnetic coupling coil based on the air gap length of the magnetic coupling coil;

a second calculation module 202 for calculating an effective cross-sectional area of the magnetic coupling coil based on the equivalent magnetic permeability and a power of the magnetic coupling coil;

a third calculation module 203 for calculating number of turns of the secondary winding of the magnetic coupling coil based on the effective cross-sectional area and the equivalent magnetic permeability;

an optimization module 204 for optimizing the magnetic coupling coil based on the number of turns of the secondary winding.

In one embodiment, the first calculation module 201 is further configured for: calculating the inner diameter and outer diameter of the magnetic coupling coil based on a saturation excitation current of the magnetic coupling coil; calculating an average magnetic path length of the magnetic coupling coil based on the inner diameter and outer diameter of the magnetic coupling coil; calculating the equivalent magnetic permeability of the magnetic coupling coil based on the air gap length and the average magnetic path length of the magnetic coupling coil.

In one embodiment, before calculating the inner diameter and outer diameter of the magnetic coupling coil based on the saturation excitation current of the magnetic coupling coil, it is also needed to compare magnetic core parameters of different materials to determine the material of the magnetic core. Specifically, materials with larger initial magnetic permeability and saturation magnetic induction intensity are selected as the winding core material. Determine the inner diameter length of the magnetic coupling coil based on the wire diameter of the field high-voltage circuit and considering factors such as the thickness of the core protective box, the thickness of the winding, the thickness of the fixed structure of the inner core, and the thickness of the clamping structure between the cable and the energy-taking winding, so that the inner diameter length of the magnetic coupling coil is as small as possible.

Specifically, after determining the inner diameter of the magnetic coupling coil, it is also needed to determine the outer diameter of the magnetic coupling coil.

The first calculation module 201 is also specifically configured for:

Calculating the outer diameter of the magnetic coupling coil based on the saturation excitation current of the magnetic coupling coil and the following saturation excitation current calculation formula:

$$I_{umax} = \frac{\pi B_s (D - d)}{u_0 u_r \ln \frac{D}{d}}$$

where, $I_{umax}$ is the saturation excitation current of the magnetic coupling coil, $B_s$ is the saturation magnetic induction intensity of the magnetic coupling coil, $u_0$ is the vacuum permeability of the magnetic coupling coil, $u_r$ is the relative permeability of the magnetic core when it is not cut, D is the outer diameter of the magnetic coupling coil, d is the inner diameter of the magnetic coupling coil.

Wherein, the saturation excitation current of the magnetic coupling coil is equal to the primary current.

Specifically, after determining the inner diameter and outer diameter of the magnetic coupling coil, the average magnetic path length of the magnetic coupling coil can be determined. Specifically, the average magnetic path length of the magnetic coupling coil is the sum of the inner diameter, outer diameter, and height of the magnetic coupling coil. The height of the magnetic coupling coil can be measured directly after determining the inner diameter and outer diameter.

Specifically, in order to facilitate the installation of CT energy acquisition devices on high-voltage transmission lines, the magnetic coupling coil needs to be made as an open type, so an air gap is inevitably introduced. Although the air gap can effectively prevent saturation, the air gap has an impact on the magnetic core permeability. The impact is relatively large. The cross section of the magnetic core should be polished to be smooth and the length of the air gap should be reduced as much as possible to minimize impact of the air gap. Then, the magnetic permeability of the magnetic coupling coil is the equivalent magnetic permeability of the magnetic coupling coil.

Specifically, after determining the average magnetic path length of the magnetic coupling coil, the first calculation module 201 may calculate the equivalent magnetic permeability of the magnetic coupling coil based on the air gap length and the average magnetic path length of the magnetic coupling coil. Calculating the equivalent magnetic permeability of the magnetic coupling coil based on the air gap length and the average magnetic path length of the magnetic coupling coil comprises:

Calculating the equivalent magnetic permeability of the magnetic coupling coil based on the air gap length of the magnetic coupling coil, the average magnetic path length and the following formula:

$$\mu = \frac{u_r}{1 + \frac{l_g}{l + l_g}}$$

Where, $\mu$ represents the equivalent magnetic permeability of the magnetic coupling coil, $u_r$ represents the relative permeability of the core when it is not cut, $l_g$ represents the air gap length of the magnetic coupling coil, l represents the average magnetic path length of the magnetic coupling coil.

In one embodiment, when the current is relatively small, the cross-sectional area of the magnetic core that meets the output power requirements can be obtained based on the current fluctuation range of the high-voltage circuit and the magnetic coupling coil output power formula, that is, referring to the power requirement of the load. The second calculation module 202 is specifically configured for:

Calculating the effective cross-sectional area of the magnetic coupling coil based on the equivalent magnetic permeability, the power of the magnetic coupling coil and the following power formula:

$$P = \frac{U_2^2}{R} = \frac{\pi \mu f A I_1^2}{l}$$

where, P represents the power of the magnetic coupling coil, $U_2$ represents the output voltage of the magnetic coupling coil, R represents the load resistance, f represents the frequency of the primary current, $I_1$ represents the magnitude of the primary current, and A represents the effective cross-sectional area of the magnetic coupling coil, l represents the average magnetic path length of the magnetic coupling coil, $\mu$ represents the equivalent magnetic permeability of the magnetic coupling coil.

In one embodiment, after the second calculation module 202 determines the effective cross-sectional area of the magnetic coupling coil, the third calculation module 203 may determine the number of turns of the secondary winding of the magnetic coupling coil based on the following formula:

$$P = \frac{U_2^2}{R} = \frac{I_1^2}{\left(\frac{1}{k^2 N_2^2} + \frac{N_2^2}{R^2}\right) R} \leq \frac{k I_1^2}{2} = \frac{\pi \mu f A I_1^2}{l}$$

where, P represents the power of the magnetic coupling coil, $U_2$ represents the output voltage of the magnetic coupling coil, R represents the load resistance, f represents the frequency of the primary current, $I_1$ represents the magnitude of the primary current, and A represents the effective cross-sectional area of the magnetic coupling coil, l represents the average magnetic path length of the magnetic coupling coil, $\mu$ represents the equivalent magnetic permeability of the magnetic coupling coil, and $N_2$ represents the number of turns of the secondary winding.

The winding output power reaches the maximum if and only if the number of turns of the secondary winding $N_2$ of the winding satisfies $N_2 = \sqrt{R/k}$, where the formula of k is:

$$k = \frac{2 \pi \mu f A}{l}$$

f represents the frequency of the primary current, A represents the effective cross-sectional area of the magnetic coupling coil, and μ represents the equivalent magnetic permeability of the magnetic coupling coil.

In one embodiment, the magnetic coupling coil is installed on the transmission line, and the interference is relatively serious. Therefore, the optimization module 204 is used to optimize the number of secondary turns and optimize the winding method of the magnetic coupling coil. On one hand is to keep the winding density and cross-sectional area uniform, which can eliminate or effectively reduce the influence of the parallel component of the interference magnetic field and the relative position changes of the wire and the winding; on the other hand is to wind a loop in the center of the skeleton that is opposite to the direction of the winding, which can eliminate or effectively reduce the influence of the vertical component of the interference magnetic field.

As shown in FIG. 3, in one embodiment, it is an internal structure diagram of a computer device. The computer device may be a magnetic coupling coil optimization device, or a terminal or server connected to a magnetic coupling coil optimization device. As shown in FIG. 3, the computer device comprises a processor, a memory, and a network interface connected through a system bus. Wherein, the memory comprises non-volatile storage media and internal memory. The non-volatile storage medium of the computer device stores an operating system and a computer program. When the computer program is executed by the processor, the processor can implement a magnetic coupling coil optimization method. A computer program may also be stored in the internal memory. When the computer program is executed by the processor, the computer program may cause the processor to execute a magnetic coupling coil optimization method. Network interface is used for communicating with external devices. Those skilled in the art should understand that the structure shown in FIG. 3 is only a block diagram of a partial structure related to the solution provided by the present application, and does not constitute a limitation on the computer equipment to which the solution of the present application is applied. The specific computer equipment may contain more or fewer parts than as shown, or combine certain parts, or have a different arrangement of parts.

In one embodiment, a magnetic coupling coil optimization method provided in this application can be implemented in the form of a computer program, and the computer program can be run on the computer device as shown in FIG. 3. Each program template that constitutes the line lightning protection effect evaluation device can be stored in the memory of the computer device. For example, the first calculation module 201, the second calculation module 202, the third calculation module 203, and the optimization module 204.

A computer device comprises a memory and a processor. The memory stores a computer program. When the computer program is executed by the processor, the processor performs the following steps: calculating an equivalent magnetic permeability of a magnetic coupling coil based on an air gap length of the magnetic coupling coil; calculating an effective cross-sectional area of the magnetic coupling coil based on the equivalent magnetic permeability and the power of the magnetic coupling coil; calculating a number of turns of the secondary winding of the magnetic coupling coil based on the effective cross-sectional area and the equivalent magnetic permeability; optimizing the magnetic coupling coil based on the number of turns of the secondary winding.

In one embodiment, the magnetic coupling coil is an open type winding.

In one embodiment, calculating the equivalent magnetic permeability of the magnetic coupling coil based on the air gap length of the magnetic coupling coil comprises: calculating the inner diameter and outer diameter of the magnetic coupling coil based on a saturation excitation current of the magnetic coupling coil; calculating an average magnetic path length of the magnetic coupling coil based on the inner diameter and outer diameter of the magnetic coupling coil; calculating the equivalent magnetic permeability of the magnetic coupling coil based on the air gap length and the average magnetic path length of the magnetic coupling coil.

In one embodiment, calculating the outer diameter of the magnetic coupling coil based on a saturation excitation current of the magnetic coupling coil comprises: calculating the outer diameter of the magnetic coupling coil based on the saturation excitation current of the magnetic coupling coil and the following saturation excitation current calculation formula:

$$I_{umax} = \frac{\pi B_s (D - d)}{u_0 u_r \ln \frac{D}{d}}$$

Where, $I_{umax}$ is the saturation excitation current of the magnetic coupling coil, $B_s$ is the saturation magnetic induction intensity of the magnetic coupling coil, $u_0$ is the vacuum permeability of the magnetic coupling coil, $u_r$ is the relative permeability of the magnetic core when it is not cut, D is the outer diameter of the magnetic coupling coil, d is the inner diameter of the magnetic coupling coil.

In one embodiment, calculating the effective cross-sectional area of the magnetic coupling coil based on the equivalent magnetic permeability and the power of the magnetic coupling coil comprises: calculating the effective cross-sectional area of the magnetically coupled winding based on the equivalent magnetic permeability, the power of the magnetic coupling coil and the following power formula:

$$P = \frac{U_2^2}{R} = \frac{\pi \mu f A I_1^2}{l}$$

where, $U_2$ represents the output voltage of the magnetic coupling coil, R represents the load resistance, f represents the frequency of the primary current, $I_1$ represents the magnitude of the primary current, and A represents the effective cross-sectional area of the magnetic coupling coil, l represents the average magnetic path length of the magnetic coupling coil, μ represents the equivalent magnetic permeability of the magnetic coupling coil.

In one embodiment, the method further comprises: designing an anti-surge module based on the power of the magnetic coupling coil, the anti-surge module being connected to the output end of the magnetic coupling coil, and the anti-surge module being used to protect a circuit in connection with the magnetic coupling coil.

In one embodiment, the method further comprises: designing an overvoltage protection module based on the output voltage of the magnetic coupling coil, the overvoltage protection module being connected to the output end of the magnetic coupling coil, and the overvoltage protection module is used to protect circuit connected to the magnetic coupling coil.

A computer-readable storage medium that stores a computer program. When the computer program is executed by a processor, it causes the processor to perform the following steps: calculating an equivalent magnetic permeability of a magnetic coupling coil based on an air gap length of the magnetic coupling coil; calculating an effective cross-sectional area of the magnetic coupling coil based on the equivalent magnetic permeability and the power of the magnetic coupling coil; calculating a number of turns of the secondary winding of the magnetic coupling coil based on the effective cross-sectional area and the equivalent magnetic permeability; optimizing the magnetic coupling coil based on the number of turns of the secondary winding.

In one embodiment, the magnetic coupling coil is an open type winding.

In one embodiment, calculating the equivalent magnetic permeability of the magnetic coupling coil based on the air gap length of the magnetic coupling coil comprises: calculating the inner diameter and outer diameter of the magnetic coupling coil based on a saturation excitation current of the magnetic coupling coil; calculating an average magnetic path length of the magnetic coupling coil based on the inner diameter and outer diameter of the magnetic coupling coil; calculating the equivalent magnetic permeability of the magnetic coupling coil based on the air gap length and the average magnetic path length of the magnetic coupling coil.

In one embodiment, the magnetic coupling coil is an open type winding.

In one embodiment, calculating the equivalent magnetic permeability of the magnetic coupling coil based on the air gap length of the magnetic coupling coil comprises: calculating the inner diameter and outer diameter of the magnetic coupling coil based on a saturation excitation current of the magnetic coupling coil; calculating an average magnetic path length of the magnetic coupling coil based on the inner diameter and outer diameter of the magnetic coupling coil; calculating the equivalent magnetic permeability of the magnetic coupling coil based on the air gap length and the average magnetic path length of the magnetic coupling coil.

In one embodiment, calculating the outer diameter of the magnetic coupling coil based on a saturation excitation current of the magnetic coupling coil comprises: calculating the outer diameter of the magnetic coupling coil based on the saturation excitation current of the magnetic coupling coil and the following saturation excitation current calculation formula:

$$I_{umax} = \frac{\pi B_s (D - d)}{u_0 u_r \ln \frac{D}{d}}$$

Where, $I_{umax}$ is the saturation excitation current of the magnetic coupling coil, $B_s$ is the saturation magnetic induction intensity of the magnetic coupling coil, $u_0$ is the vacuum permeability of the magnetic coupling coil, $u_r$ is the relative permeability of the magnetic core when it is not cut, D is the outer diameter of the magnetic coupling coil, d is the inner diameter of the magnetic coupling coil.

In one embodiment, calculating the effective cross-sectional area of the magnetic coupling coil based on the equivalent magnetic permeability and the power of the magnetic coupling coil comprises: calculating the effective cross-sectional area of the magnetically coupled winding based on the equivalent magnetic permeability, the power of the magnetic coupling coil and the following power formula:

$$P = \frac{U_2^2}{R} = \frac{\pi \mu f A l_1^2}{l}$$

where, $U_2$ represents the output voltage of the magnetic coupling coil, R represents the load resistance, f represents the frequency of the primary current, $I_1$ represents the magnitude of the primary current, and A represents the effective cross-sectional area of the magnetic coupling coil, l represents the average magnetic path length of the magnetic coupling coil, $\mu$ represents the equivalent magnetic permeability of the magnetic coupling coil.

In one embodiment, the method further comprises: designing an anti-surge module based on the power of the magnetic coupling coil, the anti-surge module being connected to the output end of the magnetic coupling coil, and the anti-surge module being used to protect a circuit in connection with the magnetic coupling coil.

In one embodiment, the method further comprises: designing an overvoltage protection module based on the output voltage of the magnetic coupling coil, the overvoltage protection module being connected to the output end of the magnetic coupling coil, and the overvoltage protection module is used to protect circuit connected to the magnetic coupling coil.

Those of ordinary skill in the art should understand that all or part of the processes in the methods of the above embodiments may be completed by instructing relevant hardware through a computer program. The program can be stored in a computer-readable storage medium. When being executed, the program may include the processes of the above method embodiments. Wherein, the storage medium may be a magnetic disk, an optical disk, a read-only memory (ROM) or a random-access memory (RAM), etc.

Description provided above represents the preferred embodiment of the present application only, thus is not intended to limit the scope of rights of the present application. Any modifications made in accordance with the claims of the present application under principle of equivalency still fall within the scope of this application.

What is claimed is:

1. A magnetic coupling coil optimization method, characterized in that the method comprises:

calculating an equivalent magnetic permeability of the magnetic coupling coil based on an air gap length of the magnetic coupling coil;

calculating an effective cross-sectional area of the magnetic coupling coil based on the equivalent magnetic permeability and power of the magnetic coupling coil;

calculating number of turns of the secondary winding of the magnetic coupling coil based on the effective cross-sectional area and the equivalent magnetic permeability;

optimizing the magnetic coupling coil based on the number of turns of the secondary winding;

the magnetic coupling coil is an open type winding;

wherein calculating the equivalent magnetic permeability of the magnetic coupling coil based on the air gap length of the magnetic coupling coil comprises:

calculating the inner diameter and outer diameter of the magnetic coupling coil based on a saturation excitation current of the magnetic coupling coil;

calculating an average magnetic path length of the magnetic coupling coil based on the inner diameter and outer diameter of the magnetic coupling coil;

calculating the equivalent magnetic permeability of the magnetic coupling coil based on the air gap length and the average magnetic path length of the magnetic coupling coil.

2. The method according to claim 1, characterized in that calculating the outer diameter of the magnetic coupling coil based on a saturation excitation current of the magnetic coupling coil comprises:

calculating the outer diameter of the magnetic coupling coil based on the saturation excitation current of the magnetic coupling coil and the following saturation excitation current calculation formula:

$$I_{umax} = \frac{\pi B_s (D - d)}{u_0 u_r \ln\frac{D}{d}}$$

where, $I_{umax}$ is the saturation excitation current of the magnetic coupling coil, $B_s$ is the saturation magnetic induction intensity of the magnetic coupling coil, $u_o$ is the vacuum permeability of the magnetic coupling coil, $u_r$ is the relative permeability of the magnetic core when it is not cut, D is the outer diameter of the magnetic coupling coil, d is the inner diameter of the magnetic coupling coil.

3. The method according to claim 1, characterized in that calculating the effective cross-sectional area of the magnetic coupling coil based on the equivalent magnetic permeability and the power of the magnetic coupling coil comprises:

calculating the effective cross-sectional area of the magnetically coupled winding based on the equivalent magnetic permeability, the power of the magnetic coupling coil and the following power formula:

$$P = \frac{U_2^2}{R} = \frac{\pi \mu f A I_1^2}{l}$$

where, $U_2$ represents the output voltage of the magnetic coupling coil, R represents the load resistance, f represents the frequency of the primary current, $I_1$ represents the magnitude of the primary current, and A represents the effective cross-sectional area of the magnetic coupling coil, I represents the average magnetic path length of the magnetic coupling coil, μ represents the equivalent magnetic permeability of the magnetic coupling coil.

4. The method according to claim 1, characterized in that, the method further comprises:

designing an anti-surge module based on the power of the magnetic coupling coil, the anti-surge module being connected to the output end of the magnetic coupling coil, and the anti-surge module being used to protect a circuit in connection with the magnetic coupling coil.

5. The method according to claim 1, characterized in that, the method further comprises:

designing an overvoltage protection module based on the output voltage of the magnetic coupling coil, the overvoltage protection module being connected to the output end of the magnetic coupling coil, and the overvoltage protection module is used to protect circuit connected to the magnetic coupling coil.

6. A computer device, characterized in comprising a memory and a processor, the memory storing a computer program such that when the computer program is executed by the processor, the processor performs steps of the methods according to claim 1.

7. A computer-readable storage medium characterized in storing a computer program such that when the computer program is executed by the processor, the processor performs steps of the methods according to claim 1.

8. The computer device according to claim 6, characterized in that calculating the outer diameter of the magnetic coupling coil based on a saturation excitation current of the magnetic coupling coil comprises:

calculating the outer diameter of the magnetic coupling coil based on the saturation excitation current of the magnetic coupling coil and the following saturation excitation current calculation formula:

$$I_{umax} = \frac{\pi B_s (D - d)}{u_0 u_r \ln\frac{D}{d}}$$

where, $I_{umax}$ is the saturation excitation current of the magnetic coupling coil, $B_s$ is the saturation magnetic induction intensity of the magnetic coupling coil, $u_o$ is the vacuum permeability of the magnetic coupling coil, $u_r$ is the relative permeability of the magnetic core when it is not cut, D is the outer diameter of the magnetic coupling coil, d is the inner diameter of the magnetic coupling coil.

9. The computer device according to claim 6, characterized in that calculating the effective cross-sectional area of the magnetic coupling coil based on the equivalent magnetic permeability and the power of the magnetic coupling coil comprises:

calculating the effective cross-sectional area of the magnetically coupled winding based on the equivalent magnetic permeability, the power of the magnetic coupling coil and the following power formula:

$$P = \frac{U_2^2}{R} = \frac{\pi \mu f A I_1^2}{l}$$

where, $U_2$ represents the output voltage of the magnetic coupling coil, R represents the load resistance, f represents the frequency of the primary current, $I_1$ represents the magnitude of the primary current, and A represents the effective cross-sectional area of the magnetic coupling coil, I represents the average magnetic path length of the magnetic coupling coil, μ represents the equivalent magnetic permeability of the magnetic coupling coil.

10. The computer device according to claim 6, characterized in that, the method further comprises:

designing an anti-surge module based on the power of the magnetic coupling coil, the anti-surge module being connected to the output end of the magnetic coupling coil, and the anti-surge module being used to protect a circuit in connection with the magnetic coupling coil.

11. The computer device according to claim 6, characterized in that, the method further comprises:

designing an overvoltage protection module based on the output voltage of the magnetic coupling coil, the over-voltage protection module being connected to the output end of the magnetic coupling coil, and the over-voltage protection module is used to protect circuit connected to the magnetic coupling coil.

12. The computer-readable storage medium according to claim 7, characterized in that calculating the outer diameter of the magnetic coupling coil based on a saturation excitation current of the magnetic coupling coil comprises:

calculating the outer diameter of the magnetic coupling coil based on the saturation excitation current of the magnetic coupling coil and the following saturation excitation current calculation formula:

$$I_{umax} = \frac{\pi B_s (D - d)}{u_0 u_r \ln\frac{D}{d}}$$

where, $I_{umax}$ is the saturation excitation current of the magnetic coupling coil, $B_s$ is the saturation magnetic induction intensity of the magnetic coupling coil, $u_o$ is the vacuum permeability of the magnetic coupling coil, $u_r$ is the relative permeability of the magnetic core when it is not cut, D is the outer diameter of the magnetic coupling coil, d is the inner diameter of the magnetic coupling coil.

13. The computer-readable storage medium according to claim 7, characterized in that calculating the effective cross-sectional area of the magnetic coupling coil based on the equivalent magnetic permeability and the power of the magnetic coupling coil comprises:

calculating the effective cross-sectional area of the magnetically coupled winding based on the equivalent magnetic permeability, the power of the magnetic coupling coil and the following power formula:

$$P = \frac{U_2^2}{R} = \frac{\pi \mu f A I_1^2}{l}$$

where, $U_2$ represents the output voltage of the magnetic coupling coil, R represents the load resistance, f represents the frequency of the primary current, $I_1$ represents the magnitude of the primary current, and A represents the effective cross-sectional area of the magnetic coupling coil, I represents the average magnetic path length of the magnetic coupling coil, $\mu$ represents the equivalent magnetic permeability of the magnetic coupling coil.

14. The computer-readable storage medium according to claim 7, characterized in that, the method further comprises:

designing an anti-surge module based on the power of the magnetic coupling coil, the anti-surge module being connected to the output end of the magnetic coupling coil, and the anti-surge module being used to protect a circuit in connection with the magnetic coupling coil.

15. The computer-readable storage medium according to claim 7, characterized in that, the method further comprises:

designing an overvoltage protection module based on the output voltage of the magnetic coupling coil, the over-voltage protection module being connected to the output end of the magnetic coupling coil, and the over-voltage protection module is used to protect circuit connected to the magnetic coupling coil.

\*  \*  \*  \*  \*